United States Patent [19]
Watai et al.

[11] Patent Number: 5,467,292
[45] Date of Patent: Nov. 14, 1995

[54] LOGICAL OPERATION METHOD EMPLOYING PARALLEL ARITHMETIC UNIT

[75] Inventors: Hiroo Watai, Fuji; Takao Nishida, Kokubunji; Takaharu Nagumo, Hadano; Masahiko Nagai, Yamanishi, all of Japan

[73] Assignee: Hitachi, Ltd., Tokyo, Japan

[21] Appl. No.: 895,802

[22] Filed: Jun. 9, 1992

[30] Foreign Application Priority Data

Jun. 12, 1991 [JP] Japan .................................. 3-140296

[51] Int. Cl.⁶ .................................................. G06F 9/44
[52] U.S. Cl. ..................................... 364/578; 364/489
[58] Field of Search ................................. 395/800, 500; 364/578, 489; 371/23

[56] References Cited

U.S. PATENT DOCUMENTS

| | | | |
|---|---|---|---|
| 4,769,817 | 9/1988 | Krohn et al. ............................... | 371/23 |
| 4,899,273 | 2/1990 | Omoda et al. ............................ | 395/500 |
| 5,051,941 | 9/1991 | Takamine et al. ......................... | 364/578 |
| 5,184,308 | 2/1993 | Nagai et al. .............................. | 364/489 |

*Primary Examiner*—Eric Coleman
*Assistant Examiner*—L. Donaghue
*Attorney, Agent, or Firm*—Meltzer, Lippe, et al.

[57] ABSTRACT

A logical operation method for evaluating a train of output data to be obtained when a plurality of input patterns are successively applied to a memory element whose output value depends upon a sequence of input values. For each of the plurality of patterns in time series, the method decides whether or not the pertinent pattern is a holding pattern which means that the output value of the memory element depends upon a preceding pattern. Subsequently, the method evaluates a first train of data which consists of flags each indicating whether or not the respective pattern is the holding pattern, and a second train of data which consist of a predetermined logical values for the holding patterns and output logical values of the memory element for the non-holding patterns. Finally, the method subjects the first and second trains of data to operations in parallel by the use of a parallel arithmetic unit, thereby obtaining the train of output data of the memory element in parallel. High-speed logic/fault simulations can be realized even for a synchronous sequential circuit with the parallel arithmetic unit such as vector computer. This makes it possible to sharply reduce the number of man-hour and shorten the processing period of time in the verification of logic and the generation of test data.

3 Claims, 9 Drawing Sheets

| R | 0 | 0 | 1 | 1 |
|---|---|---|---|---|
| S | 0 | 1 | 0 | 1 |
| Q | HOLD | 1 | 0 | 0 |

902

| PATTERN NO. | 1 | 2 | 3 |
|---|---|---|---|
| R | 0 | 0 | 1 |
| S | 1 | 0 | 0 |
| Q | 1 | X | 0 |

903

↑ UNSETTLED

LOGICAL OPERATION METHOD EMPLOYING PARALLEL ARITHMETIC UNIT

BACKGROUND OF THE INVENTION

The present invention relates to a logic verifying technique and a test-data generating method for logic circuits. More particularly, it relates to techniques which perform logic simulation or fault simulation for a synchronous sequential circuit including memory elements, at high speed by utilizing arithmetical units such as a vector computer or a parallel processor.

Heretofore, regarding a method wherein the logic simulation and fault simulation of a logic circuit are performed at high speed by utilizing a parallel arithmetic unit such as a vector computer, a fault simulation method which is based on an expanded parallel technique, i.e., a dynamic two-dimensional parallel technique for a combinational circuit has been known as stated in, for example, the Proceedings of the Society of Information Processing, Vol. 29, No. 5, pp. 522–528.

In the parallel arithmetic unit, a plurality of processes are executed in parallel at one time, thereby realizing an increased speed of computation. Accordingly, it is absolutely essential to contrive a data organization and processing steps with which the largest possible number of independent events can be collected and processed in parallel. Also, a method which processes a plurality of input patterns in parallel is effective for logic simulation or fault simulation. With the dynamic two-dimensional parallel technique mentioned above, the paralleling of processes is implemented for a plurality of patterns on the basis of the parallel technique. This technique is such that the logical values of the series of patterns stored in vector registers are subjected to logical operations at one time for the respective patterns independently of one another.

In executing the logical operation of a memory element such as a flip-flop, however, an output logical value cannot be settled for a pattern to which the output logical value to the preceding pattern is held or kept unchanged. By way of example, in a case where, as illustrated in FIG. 9, a series of logical value patterns 903 are input to an R/S flip-flop 901 which operates in accordance with a truth table 902, '1' is set as the output value of the flip-flop to the first pattern. Then, the output value ought to be '1' to the second pattern as the actual operation of this flip-flop because the value to the preceding pattern is held. Since, however, the dynamic two-dimensional parallel technique executes the logical operations for the respective patterns at one time independently of one another, the logical value to the preceding pattern cannot be obtained for the logical operation to the second pattern, and hence, the output value cannot be settled. Accordingly, a synchronous sequential circuit including memory elements cannot be handled with this technique.

SUMMARY OF THE INVENTION

An object of the present invention is to provide a logical operation method employing a parallel arithmetic unit, in which logical operations to a plurality of input patterns for memory elements are executed in parallel, thereby permitting a synchronous sequential circuit to be subjected to logic simulation and fault simulation that utilize the parallel arithmetic unit such as a vector computer.

In order to accomplish the object, a parallel operation method employing a parallel arithmetic unit according to the present invention consists of a logical operation method wherein a train of output data to be obtained when a plurality of input patterns are successively applied to a memory element whose output value depends upon a sequence of input values are evaluated with a parallel arithmetic unit, comprising deciding for each of the plurality of input patterns in time series, whether or not the input pattern is a "holding pattern", which indicates that the memory element output value depends upon a preceding input pattern; evaluating a first train of data which consist of flags each indicating whether or not the corresponding pattern is a holding pattern, and a second train of data which consist of predetermined logical values for the holding pattern and output logical values of the memory element for non-holding patterns; and subjecting the first and second trains of data to operations (for example, iteration operations) in parallel by the use of a parallel arithmetic unit, thereby obtaining a train of memory element output in parallel.

Further, the present invention provides a logic simulation method and a fault simulation method which utilize the operation method.

A parallel processor according to the present invention consists of a parallel processor, wherein a train of output values of a memory element whose output value depends upon a sequence of input values are computed in parallel, comprising a vector register which stores therein at least n ($n \geq 2$) input patterns; a first data register which stores therein a first train of data consisting of n logical values each indicating whether or not a corresponding one of the n input patterns in time series is a holding pattern, indicating that the output value of the memory element depends upon a preceding pattern; a second data register which stores therein a second train of data consisting of n logical values in total, including predetermined logical values for the holding patterns and output logical values for the memory elements when the corresponding patterns are non-holding patterns; and a parallel arithmetic unit which subjects the contents of the first and second data registers to iteration operations.

Generally, the patterns which are applied to a memory element are classified into two sorts; (1) the pattern which means that the output value to the preceding pattern is required for the logical operation (hereinbelow, termed the "holding pattern"), and (2) the pattern which on its own suffices for settling the output logical value (hereinbelow termed the "non-holding pattern"). With note taken of this fact, the logical operations for the flip-flop 901 in FIG. 9 can be represented by the flow chart shown at numeral 101 in FIG. 1.

At the first stage, the flags of decisions indicating whether or not the pertinent patterns are the holding pattern ('1' for the holding pattern, and '0' for the non-holding pattern) are set at the bit positions of a vector register A corresponding to the respective patterns. In addition, '0' is set in bit positions of a vector register B for the holding pattern, and the output values of the memory element are computed and set therein for the non-holding patterns. Incidentally, whether or not the pertinent pattern is the holding pattern, and the output values for the non-holding patterns can be respectively decided and computed for the individual patterns by employing, for example, the vector registers in a vector computer. In the case of the R/S flip-flop 901, the holding pattern corresponds to the input values of R=0 and S=0, and the non-holding pattern any other input values. Therefore, the contents of the registers A and B for the respective patterns become as indicated at numerals 102 and 103 in FIG. 1, respectively. The processing steps as described above can be similarly performed for any memory element other than the R/S flip-flop 901 in such a way that a truth table is prepared for the particular memory element and is referred to in executing the logical operations.

Subsequently, the values 102 and 103 of the respective vector registers A and B thus obtained are subject-ed to operations called "iteration" as the second stage. This iteration is a kind of processing to be executed between operands arrayed in parallel, and it is a standard instruction in the vector computer. With the vector computer by way of example, the operations of the iteration are given by the following expression:

$$Qi=Qi-1*Ai+Bi$$

where letters A and B denote the vector registers to be referred to, letter Q denotes a vector register to set outputs therein, and symbols Ai, Bi and Qi denote the values of the i-th vector elements of the vector registers A, B and Q, respectively.

The iteration instruction can be executed by a hardware construction shown in FIG. 10 by way of example.

When the instruction is applied to the contents of the registers A and B evaluated above, the logical value at the preceding pattern Qi−1 is copied as the value Qi in response to the holding pattern (the case of Ai=1 and Bi=0), and the same logical value as the value Bi is set as the value Qi in response to the non-holding pattern (the case of Ai=0). In this way, the output logical values of the R/S flip-flop 901 in FIG. 9 can be computed in parallel for the plurality of patterns as indicated at numeral 104 in FIG. 1.

The parallel operation method can be effectively utilized for logic simulation and fault simulation.

DETAILED DESCRIPTION OF THE EMBODIMENTS

Now, embodiments of the present invention will be described in detail.

Figure 2:
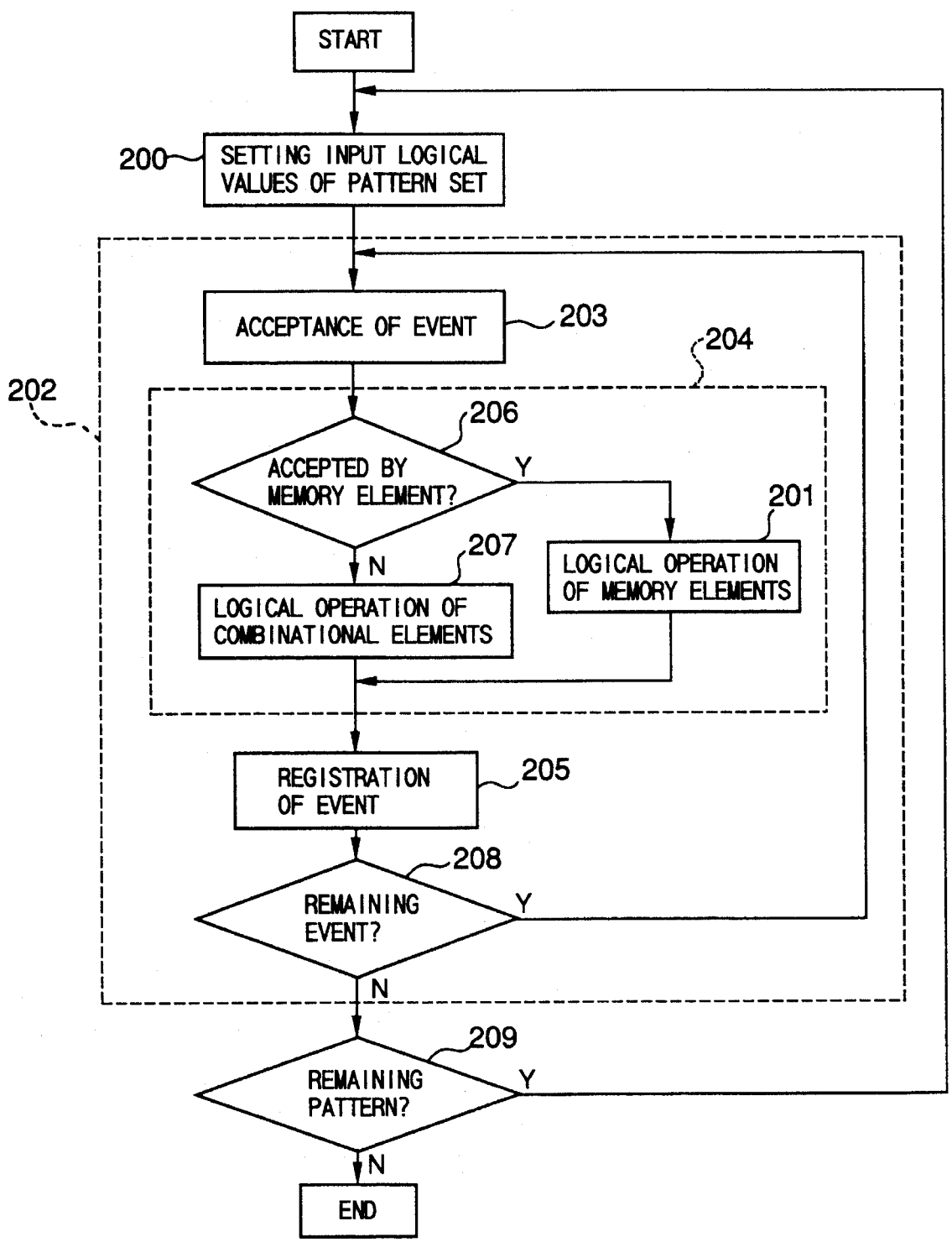
FIG. 2 is a flow chart showing the flow of the processing steps of a logic simulation which is an embodiment of the present invention.

As the first embodiment, the case of applying the present invention to logic simulation by the use of a vector computer will be explained with reference to the drawings. FIG. 2 shows the flow of the processing steps of the logic simulation according to the present invention. In the figure, the processing step of the logical operation of a memory element indicated at numeral 201 is a part which is directly pertinent to the present invention.

In general, the logic simulation computes signal changes in a circuit in such a way that each signal change is expressed as an event and that the acceptance of the event, a logical operation, and the registration of the event are iterated. Since the circuit to be handled is a synchronous sequential circuit, signal delays etc. need not be considered. It is accordingly premised that the output value of the circuit and a logical value within the circuit are settled at the application of each pattern. Incidentally, the "event" in this embodiment is defined as the signal change which arises when a signal value for a certain pattern is compared with a signal value for a pattern preceding the certain pattern by n patterns, because the n patterns (hereinbelow, the set of these patterns shall be called a "pattern set") are processed at the same time (namely, in parallel).

Figure 3:
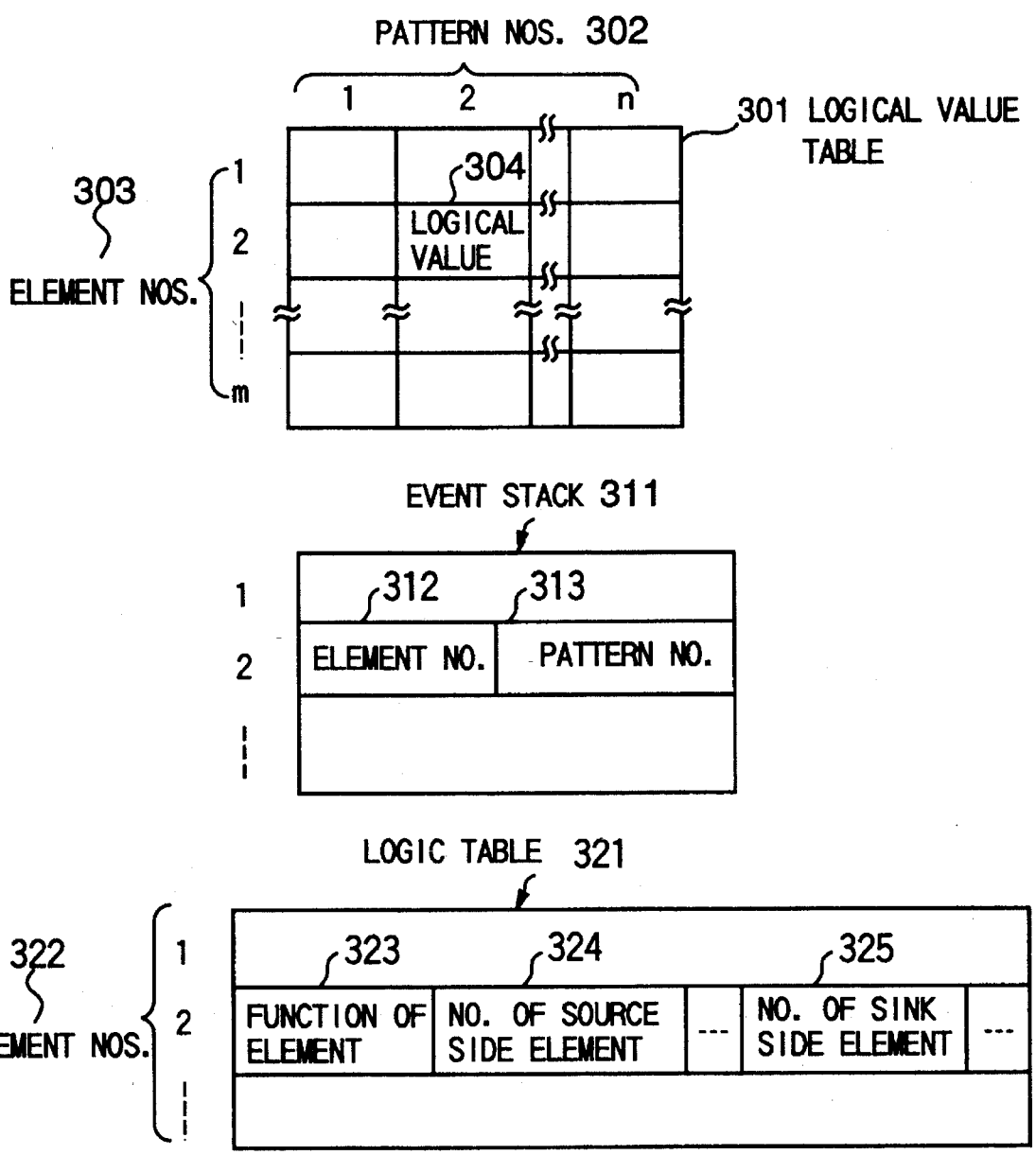
FIG. 3 is a diagram for explaining tables which are used in the logic simulation of the present invention.

As shown in FIG. 2, in the logic simulation, the input logical values of a pattern set are first set (200). In other words, for those elements which receive input logical values, a plurality of patterns corresponding to one pattern set are set at the respective positions of a logical value table 301 (FIG. 3). At the succeeding step of accepting an event (203), in a case where an event has occurred in a certain element, an element connected to the sink side of the certain element is picked out and has its input signal value found. Incidentally, when the initial pattern set has been set, the last pattern set is not existent, and hence, all input logical values are unconditionally regarded as having changed. In the next process for the logical operation of an element (204), the logical value of the registered element is computed. At the step of registering an event (205), the event is registered only when the logical value of the element has changed from the previous status thereof. If there is any remaining event (208), the control flow retrocedes to the event accepting step 203. If no event remains, the control How retrocedes to the step of setting the input logical values of a pattern set (200) until no succeeding pattern set exists (209). Incidentally, in the logical operation process (204), whether or not an acceptor element is a memory one is decided (206). Besides, if it is the memory element, the logical operation thereof is executed (201), and if not, the logical operation of a combinational logic element is executed (207).

In order to realize these processing steps, tables shown in FIG. 3 are used. The logical value table 301 is a two-dimensional table which is appointed by pattern Nos. within one pattern set as indicated at numeral 302 and the element Nos. of all elements within the circuit to-be-handled as indicated at numeral 303, and in which the logical values 304 of the individual elements are stored for the respective patterns. The event stack 311 stores therein the pairs of the element Nos. of the elements having accepted events as indicated at numeral 312, with the pattern Nos. indicated at numeral 313. The logic table 321 stores therein the functions 323 of the individual elements in the circuit, Nos. of source side elements corresponding to the input pins of the respective elements as indicated at numeral 324, and Nos. of sink side elements corresponding to the output pins of the respective elements as indicated at numeral 325, thereby expressing the connective relationship of the logic.

Next, how to use these tables will be described in more detail along the processing flow of FIG. 2. First, the logical values of one pattern set are set at the parts of the logical value table 301 corresponding to input pins. Besides, the Nos. of elements on the sink sides of the input pins are retrieved from the logic table 321, and the element Nos. as well as pattern Nos. corresponding thereto are registered in the event stack 311 (200). Herein, as stated before, in setting the initial pattern set, a pattern set for the previous time does not exist, so that all the input logical values are unconditionally regarded as having changed. Thus, the elements to receive the input logical values are registered in the event stack 311 together with these logical values. Subsequently, at the event acceptance step (203), the logical values of source elements which have the registered elements on the sink sides are collected using the element Nos. registered in the event stack 311, as keys. In the logical operation process (204), the elements registered in the event stack 311 within the pattern set are gathered and are subjected to logical operations. Here, in a case where a memory element and a combinational logic element are included in the registration of the event stack 311, the logical operation of the memory element and that of the combinational logic element other than the memory element are executed by separate methods. The logical operation process will be detailed later. In a case where, as the result of the logical operation, the logical value of the pertinent element to the pattern thereof differs as compared with the logical value registered at the corresponding part of the logical value table 301, it is regarded as an event and is registered in the event stack 311 (205). The processing steps of the event acceptance, logical operation and event registration are iterated until no unprocessed event remains (208). When these series of processing steps (202) have been completed for one pattern set (209), the logical values of the next pattern set are set anew at the parts of the logical value table 301 corresponding to the input pins (200). On this occasion, only in a case where the logical values differ from those in the last pattern set process, they are transmitted to the sink sides of the input pins as events. Thenceforth, the processing steps 202 are reiterated. The processes thus far explained are iteratively conducted until all pattern sets are dealt with (209).

Figure 4:
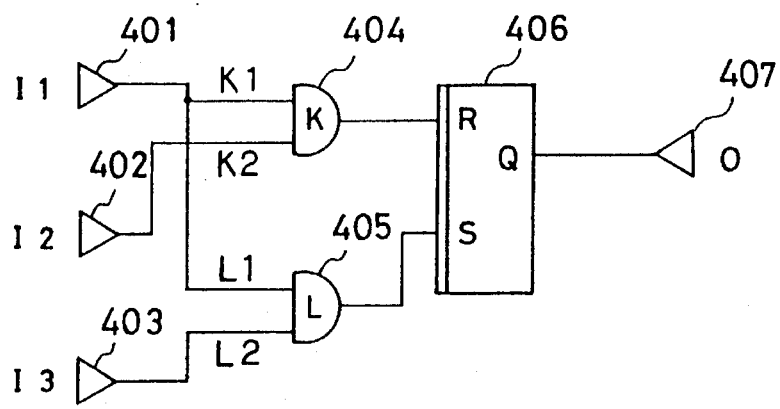
FIG. 4 is a circuit diagram showing an example of a circuit which includes an R/S flip-flop.

Now, more practicable methods of logical operations will be described in detail in conjunction with a circuit example including an R/S flip-flop as shown in FIG. 4. The illustrated example has three input points 401, 402 and 403 (I1, I2 and I3), AND gates 404 and 405 (K and L) receiving the outputs of the input points, the R/S flip-flop 406, and an output point 407 (O).

Figure 5:
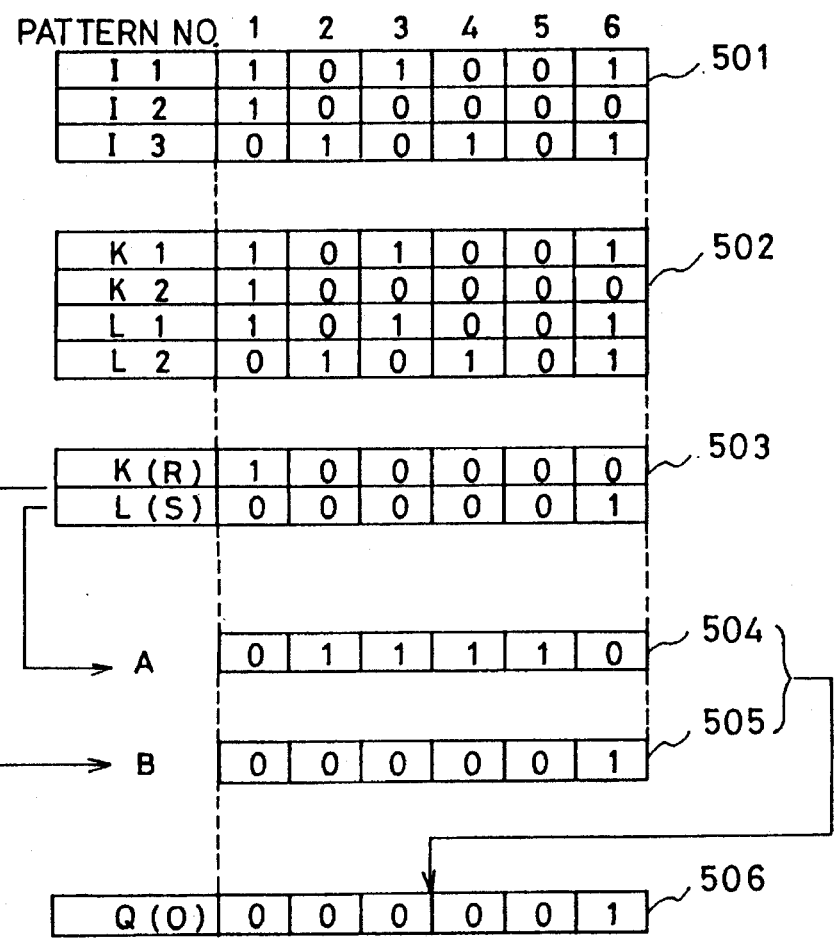
FIG. 5 is a diagram for explaining those logical values of tables and registers which develop when the logic simulation is executed in the circuit example of FIG. 4.

FIG. 5 shows a series of patterns (namely, a pattern set) 501 of pattern Nos. 1–6 which are applied to the input points I1, I2 and I3 of the circuit in FIG. 4. Here, the number of patterns of the pattern set is assumed to be '6'. In accordance with input logical values applied to the input points I1, I2 and I3, values tabulated at numeral 502 in FIG. 5 are propagated to the input pins K1, K2 and L1, L2 of the respective AND gates K and L. Here, since the AND gates K and L are both combinational logic elements, individual logical operations can be executed to the respective patterns, with the result that the output values of these AND gates become as tabulated at numeral 503 in FIG. 5. Subsequently, the output values of the AND gates K and L are directly propagated to the inputs R and S of the R/S flip-flop 406, respectively. Here, the R/S flip-flop 406 is a memory element. Therefore, even when no event is transmitted to the flip-flop 406 at a certain pattern, all the output values of this flip-flop for subsequent patterns might change under the influences of previous patterns. Accordingly, the logical operation of the flip-flop 406 needs to be executed for each of the patterns.

Figure 1:
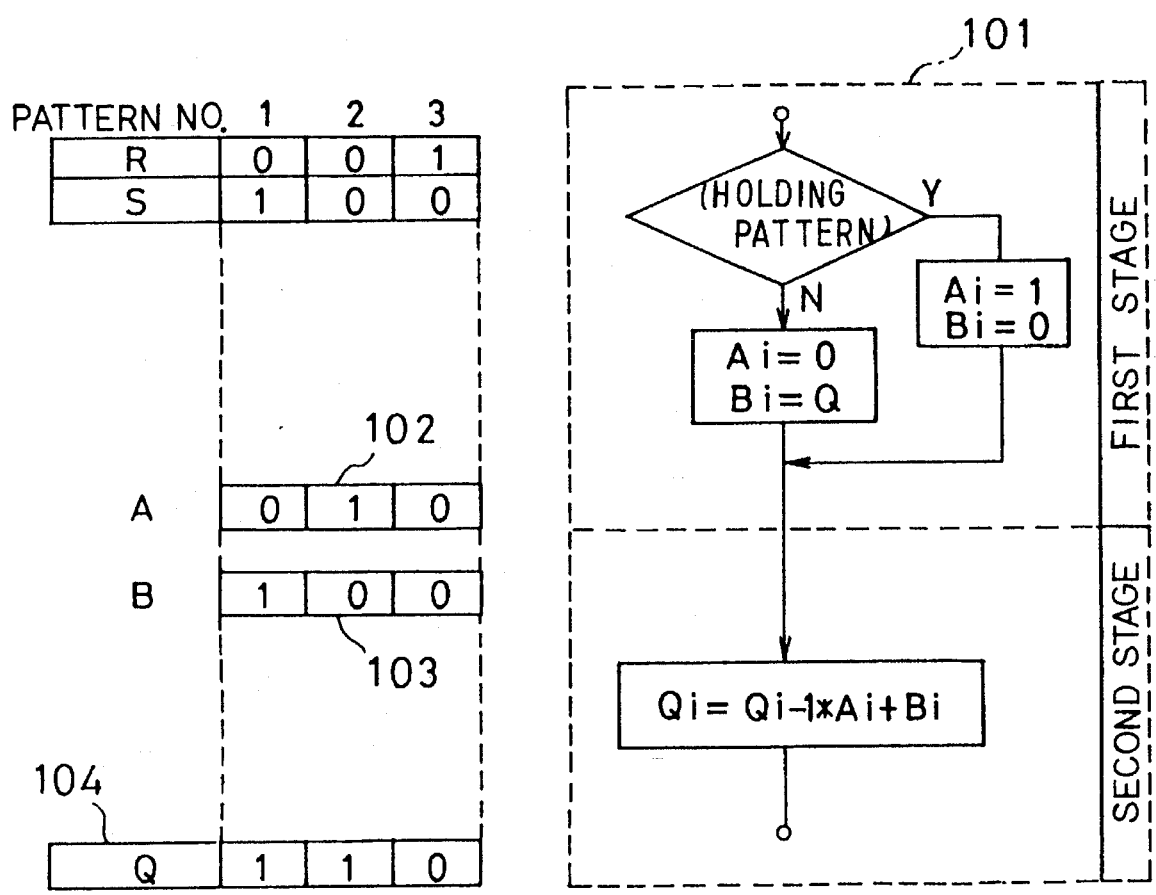
FIG. 1 is a diagram for explaining an example of a logical operation process according to the present invention.
Figure 9:
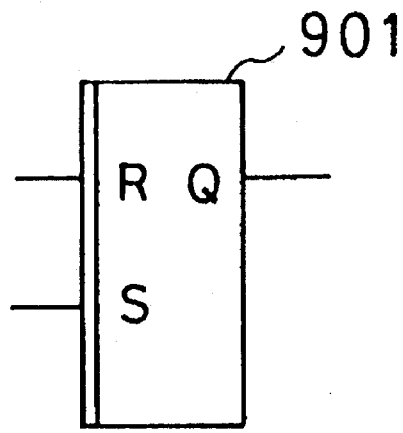
FIG. 9 is a diagram for explaining those logical values of an R/S flip-flop which develop in case of executing logical operations individually.

Here, the steps of the logical operation for the memory element (corresponding to the block 201 in FIG. 2) will be described along a flow 101 shown in FIG. 1. As indicated at numeral 504 in FIG. 5, at the first stage, '1' is set in each vector element of a vector register A when the pertinent pattern is a holding pattern (when the input values are R=0 and S=0), and '0' is set when not. Further, as indicated at numeral 505 in FIG. 5, '0' is set in each vector element of a vector register B when the pertinent pattern is the holding pattern, and the output value of the memory element for the pertinent pattern (the Q value determined by the truth table 902 in FIG. 9) is set when not. At the second stage, the iteration instruction stated before is applied to the vector registers A and B. Then, as indicated at numeral 506 in FIG. 5, the logical value at the preceding pattern is copied in response to each holding pattern, and the logical value in the vector register B as left intact is set in response to each non-holding pattern. As a result, the logical values Q (O) which are observed at the output point O can equivalently be calculated in parallel to the plurality of patterns.

Figure 10:
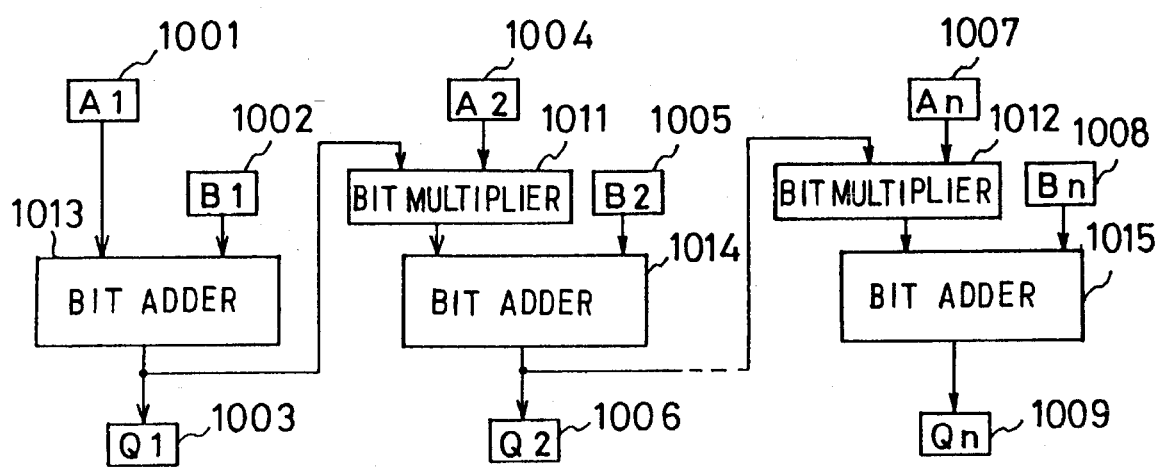
FIG. 10 is a block diagram showing a hardware construction which realizes an iteration instruction.

FIG. 10 shows a circuit example which executes the iteration instruction. The circuit example is constructed of the elements 1001, 1004, . . . and 1007 of a register A; the elements 1002, 1005, . . . and 1008 of a register B; bit adders 1013, 1014, . . . and 1015; bit multipliers 1011, . . . and 1012; and the elements 1003, 1006, . . . and 1009 of a register Q. Symbols Ai, Bi and Qi denote the i-th elements of the vector registers A, B and Q, respectively. The bit adder is a unit for obtaining the logical sum (OR) of each bit, while the bit multiplier is a unit for obtaining the logical product (AND) of each pair of bits. As the value of the element Q1, the value of the element B1 is set as it is (A1='0' is set), and as the value of the element Q2, the value of the logical sum between the value of the element B2 and the logical product of the values of the elements Q1 and A2 is set. In this manner, the operational expression of the iteration instruction is realized as a whole. Incidentally, the values of the elements Qi are serially settled in the sequence in which the number i is smaller. In this regard, both the bit adder and the bit multiplier can be operated without impressing clock pulses thereon, because none of them includes a flip-flop. Therefore, whereas n cycles are usually required for setting clock-controlled logical values serially in the elements Q1, Q2, . . . and Qn, the above operation can be realized in cycles sufficiently shorter than the n cycles in the circuit example of FIG. 10.

In the above way, even for the circuit including the memory element, the logic simulation can be executed in parallel for the plurality of patterns.

As the second embodiment, a case of applying the present invention to the generation of diagnostic data by the use of a vector computer will be described with reference to the drawings.

Figure 6:
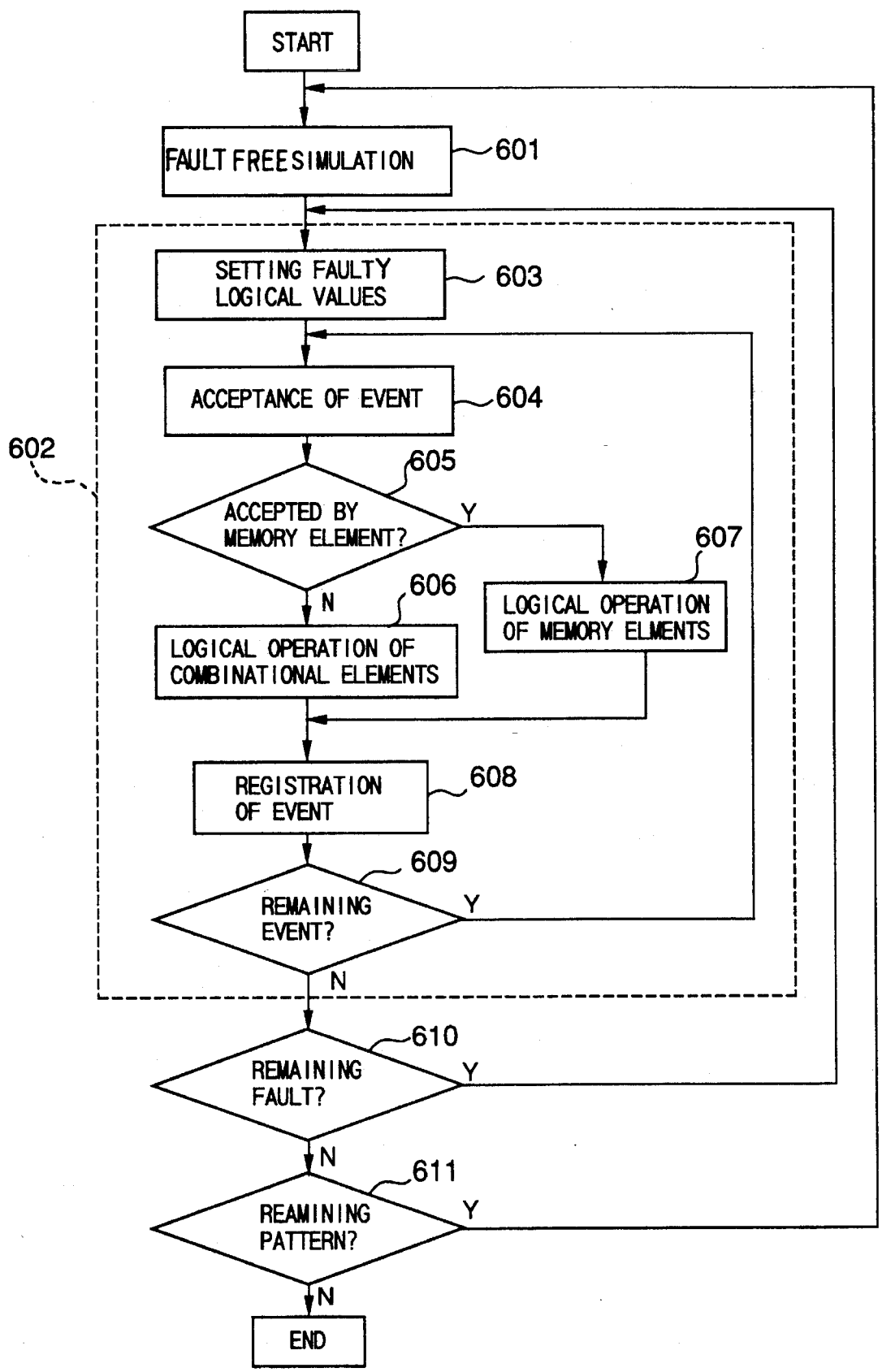
FIG. 6 is a flow chart showing the flow of a diagnostic data generating process which is another embodiment of the present invention.
Figure 7:
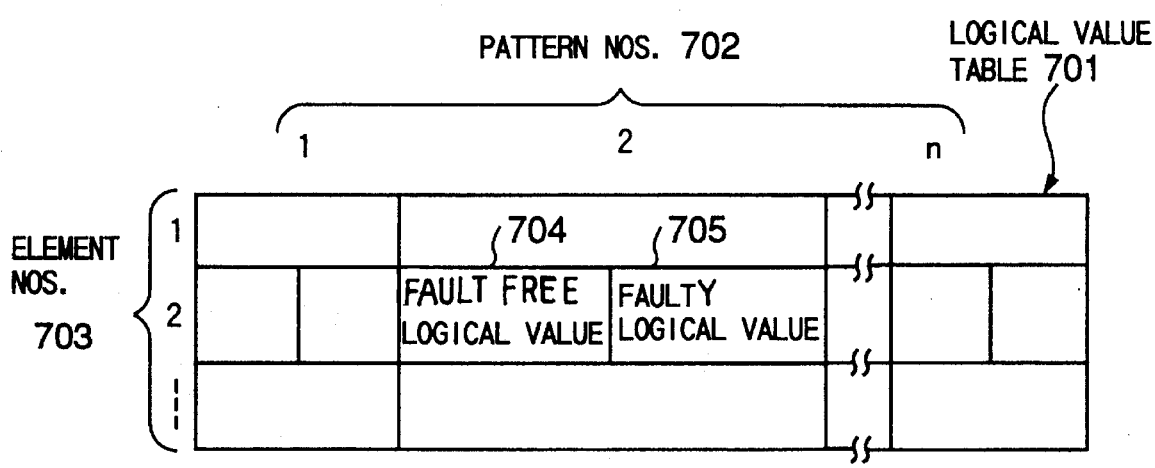
FIG. 7 is a diagram for explaining tables which are used in the fault simulation of the present invention.
Figure 7:
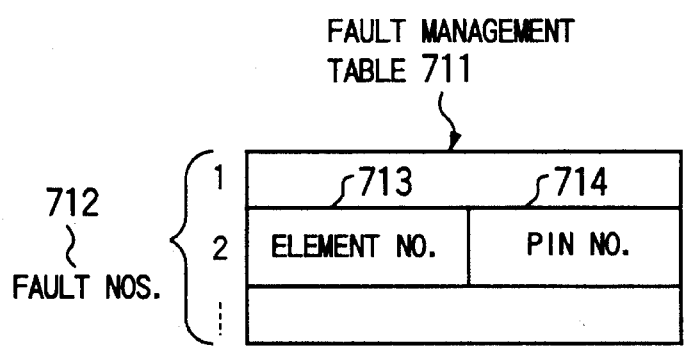

FIG. 6 shows the flow of a diagnostic data generating process according to the present invention. In a fault simulation (602), the change of signal values in the absence of any fault and in the presence of a fault in any part of a circuit arrangement is treated as an event, and a fault detected for a certain pattern is identified by processing the event. To this end, a logical value table 701 is used in which, as shown in FIG. 7, logical values at faults are added to the logical value table 301 of FIG. 3 in the foregoing embodiment. More specifically, assuming that one pattern set is constituted by n patterns, fault free logical values 704 in the absence of any fault and faulty logical values 705 in the cases of supposed faults are stored in a two-dimensional table whose locations are appointed by pattern Nos. 1 thru n as indicated at numeral 702 and the element Nos. of all elements in the circuit arrangement to-be-handled as indicated at numeral 703. Herein, the discrepancies between the fault free logical values and the faulty ones are treated as the events. The organizations of a logic table and an event stack are the same as in the first embodiment.

The processing method of the diagnostic data generation will be explained along the flow shown in FIG. 6. First, simulation for a fault free circuit is performed for every pattern set without assuming any fault, whereupon the logical values of the elements included in the circuit arrangement are computed and are set as the fault free logical values 704 of the logical value table 701 (601). This process is exactly the same as the process for each pattern set in the logic simulation of the first embodiment. Subsequently, fault values are inserted into the circuit arrangement (603), and the differences thereof from the signal values in the fault free conditions of the circuit elements are calculated. This processing step is such that the faulty logical values are registered in the locations of the logical value table 701 corresponding to supposed fault points (all the locations for one pattern set), on the basis of a fault management table 711 shown at a lower part in FIG. 7, and these cases where the faulty logical values differ from the fault free logical values are registered as the events in the event stack. Thenceforth, as in the first embodiment, the processing steps of event acceptance (604), a logical operation (605, 606, 607) and event registration (608) are iterated until no unprocessed event remains. In a case where the event has propagated to the output of the circuit arrangement, it is decided that the inserted fault has been detected for the pattern stored in the event stack (602). The above processing steps are reiterated for all faults existing within the circuit arrangement (610). Further, these series of processing steps are reiterated until all patterns are dealt with (611).

A fault simulation process for the "stuck-at 1 fault" (which means the logical value of the point is constantly fixed to be "1") of the input pin I1 (401) will be elucidated in relation to the circuit example shown in FIG. 4. The input patterns and the number of parallel patterns are assumed to be the same as in the first embodiment.

Figure 8:
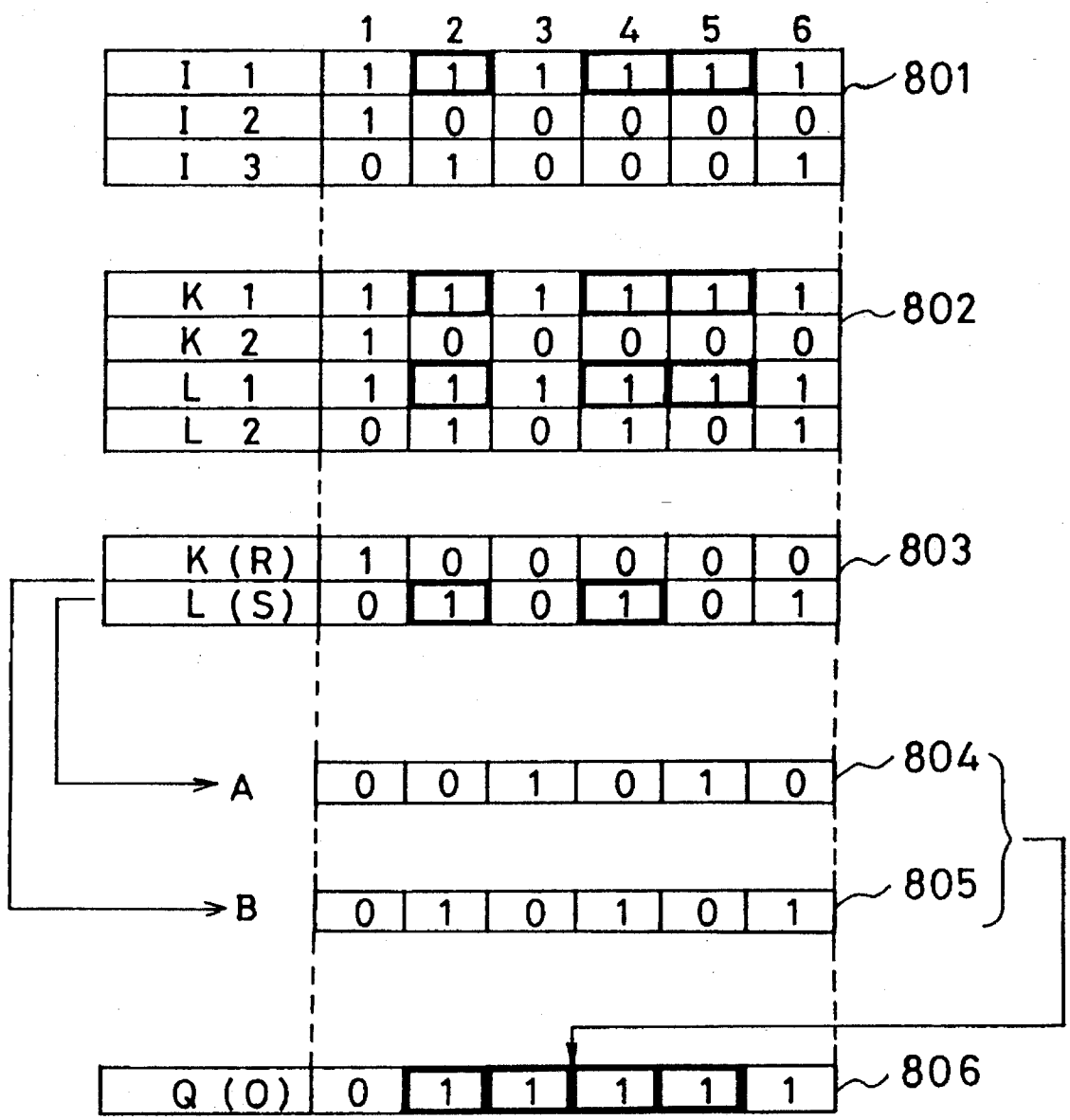
FIG. 8 is a diagram for explaining those logical values of tables and registers which develop when the fault simulation is executed in the circuit example of FIG. 4.

The logical values of the input pins I1, I2 and I3 in the presence of this fault are tabulated at numeral 801 in FIG. 8. In the tabulation, it is simulating that the input pin I1 is fixed to "1". As compared with the table 501 in FIG. 5, events are noticed as to the logical values of the second, fourth and fifth patterns enclosed with frames of bold lines. These events are respectively transmitted to the sink-side elements, namely, the AND gates K and L. Since the AND gates K and L are combinational logic elements, they execute logical operations for the individual patterns. Besides, as regards the patterns having caused the events, logical operations are executed in such a way that, as seen from a table 802 in FIG. 8, the faulty logical values are taken out from the event table 801 for those inputs of the succeeding-stage elements to which the events are propagated, whereas the fault free logical values are taken out therefrom for the other inputs. As a consequence of the operations, the output values of the AND gates K and L become as tabulated at numeral 803 in FIG. 8. When compared with the table 503 in FIG. 5, the table 803 differs in that the L output values of '1's for the second and fourth patterns are transmitted to the sink-side R/S flip-flop 406 as the events. As in the first embodiment, the logical operations need to be executed for all the patterns. In the logical operations, the faulty logical values and the fault free logical values are respectively derived from the event table for the inputs to propagate as the fault events and for the other inputs. Thereafter, the flow 101 in FIG. 1 is conformed to in the same manner as in the first embodiment. That is, at the first stage, '1' is set in the corresponding vector element of the vector register A when the pertinent pattern is the holding pattern (in other words, when the input logical values are R=0 and S=0), and '0' is set when not (804). Further, '0' is set in the corresponding vector element of the vector register B when the pertinent pattern is the holding pattern, and the output value of the R/S flip-flop 406 is set when the pertinent pattern is the non-holding pattern (805). At the second stage, the iteration instruction is applied to the vector registers A and B. Then, the output logical values of the R/S flip-flop 406 are obtained as indicated at numeral 806 in FIG. 8. When compared with the result of the simulation for fault-free state (as indicated at numeral 506 in FIG. 5), the result 806 differs in that the logical values '1's responsive to the second to fifth patterns are transmitted to the output point O of the circuit example as the events. Thus, it is decided that the specified fault is detected for the second~fifth patterns. It is accordingly understood that the fault of the input pin I1 can be detected by checking the output value for any of these patterns.

In the above way, the diagnostic data of the circuit including the memory element can be generated using the vector computer.

According to the present invention, high-speed logic/fault simulations can be realized even for a synchronous sequential circuit not having hitherto been subjected to any simulations at all, by utilizing a parallel arithmetic unit such as a vector computer. This makes it possible to sharply reduce the number of manhours and shorten the processing period of time in the verification of logic and the generation of test data.

What is claimed is:

1. A logical operation method for obtaining a train of output logical values of a memory element when a plurality of input patterns are successively applied to the memory element whose output logical value depends upon a preceding output logical value in the presence of a specified input pattern (a "holding pattern"), the logical operation method comprising the steps of:

preparing a vector processor for calculating a vector data Q from a vector data A and a vector data B in accordance with an equation $Qi=Q_{i-1}*A_i+B_i$, the $Q_i$ representing an i-th element of the vector data Q, the $Q_{i-1}$ representing an i-th minus one element of the vector data Q, the $A_i$ representing an i-th element of the vector data A and the $B_i$ representing an i-th element of the vector data B;

evaluating each of the plurality of input patterns ordered in accordance with an order in which each of the input patterns is applied to the memory element, whether it is said holding pattern;

generating, based on a result of the step of evaluating, a first vector data A whose element $A_i$ has a logical value indicating whether the i-th input patterns is said holding pattern;

generating a second vector data B whose element $B_i$ has a predetermined logical value for said holding pattern in a case where the i-th input pattern is the holding pattern, and has a same logical value with the output logical value of said memory element for the i-th input pattern in a case where the i-th input pattern is a non-holding pattern; and providing the generated vector data A and vector data B to said vector processor and calculating a vector data Q on said vector processor in accordance with said equation, thereby obtaining the calculated vector data Q whose element $Q_i$ represents an i-th output logical value of the train of output logical values and based on the calculated vector value Q, determining an output value of a simulated memory element.

2. A method of performing a logic simulation of a sequential circuit whose output value and internal status are changed by a clock control, the logic simulation method comprising the steps of:

preparing a vector processor for calculating a vector data Q from a vector data A and a vector data B in accordance with an equation $Q_i=Q_{i-1}*A_i+B_i$, the $Q_i$ representing an i-th element of the vector data Q, the $Q_{i-1}$ representing an i-th minus one element of the vector data Q, and $A_i$ representing an i-th element of the vector data A and the $B_i$ representing an i-th element of the vector data B;

generating a plurality of input patterns to be applied to a memory element included in said sequential circuit based on output logical values of a circuit portion preceding the memory element in the sequential circuit, wherein the input patterns are ordered in accordance with an order in which each of the input patterns is applied to the memory element;

evaluating for each of the plurality of input patterns, whether it is a "holding pattern" leading to an output logical value of said memory element which depends upon a preceding output logical value;

generating, based on a result of the step of evaluating, a first vector data A whose element $A_i$ has a logical value indicating whether the i-th input pattern is said holding pattern;

generating a second vector data B whose element $B_i$ has a predetermined logical value for said holding pattern in a case where the i-th input pattern is the holding pattern, and has a same logical value with the output logical value of said memory element for the i-th input pattern in a case where the i-th input pattern is a non-holding pattern; and providing the generated vector data A and vector data B to said vector processor and calculating a vector data Q on said vector processor in accordance with said equation, thereby obtaining calculated vector data Q whose element Qi represents an i-th output logical value of a train of output logical values as to said input patterns and based on the train of logical values, determining an output value of a simulated memory element.

3. A method of performing a fault simulation of a sequential circuit whose output value and internal status are changed by a clock control, the fault simulation method comprising the steps of:

a) preparing a vector processor for calculating a vector data Q from a vector data A and a vector data B in accordance with an equation $Q_i=Q_{i-1}*A_i+B_i$, the $Q_i$ representing an i-th element of the vector data Q, the $A_i$ representing an i-th element of the vector data A and the $B_i$ representing an i-th element of the vector data B;

b) generating a plurality of input patterns to be applied to a memory element included in said sequential circuit based on output logical values of a circuit portion preceding the memory element in the sequential circuit, wherein the input patterns are ordered in accordance with an order in which each of the input patterns is applied to the memory element;

evaluating for each of the plurality of input patterns, whether it is a "holding pattern" leading to an output logical value of said memory element which depends upon a preceding output logical value;

generating, based on a result the step of evaluating, a first vector data A whose element $A_i$ has a logical value indicating whether the i-th pattern is said holding pattern;

generating a second vector data B whose element $B_i$ has a predetermined logical value for said holding pattern in a case where the i-th input pattern is the holding pattern, and has a same logical value with the output logical value of said memory element for the i-th input pattern in a case where the i-th input pattern is a non-holding pattern; and providing the generated vector data A and vector data B to said vector processor and calculating a vector data Q on said vector processor in accordance with said equation, thereby obtaining calculated vector data Q whose elements $Q_i$ represents an i-th output logical value of a train of output logical values as to said input patterns;

c) subsequently, executing the same step with step (b) on a condition that logical values of a predetermined point preceding the memory element in the sequential circuit are fixed to a faulty logical value; and d) comparing the vector data Q(Q') calculated by step (b) with the vector data Q(Q") calculated by step (c), and detecting an element of the Q" whose logical value differs from a logical value of a corresponding element of Q', as an element whose logical value indicating, as to said input patterns, whether a fault of said predetermined point exists.

* * * * *